United States Patent [19]
Nesler

[11] 4,430,608
[45] Feb. 7, 1984

[54] BASE DRIVE CIRCUIT
[75] Inventor: John J. Nesler, Los Angeles, Calif.
[73] Assignee: Hughes Aircraft Company, El Segundo, Calif.
[21] Appl. No.: 333,355
[22] Filed: Dec. 22, 1981
[51] Int. Cl.³ .............................................. G05F 1/56
[52] U.S. Cl. .............................. 323/282; 307/296 A; 323/289
[58] Field of Search .................. 307/240, 246, 296 A; 323/289, 282; 363/21, 25, 97, 124

[56] References Cited
U.S. PATENT DOCUMENTS

| | | | |
|---|---|---|---|
| 3,999,086 | 12/1976 | Ekelund | 323/289 X |
| 4,242,629 | 12/1980 | Shuey | 323/282 X |
| 4,355,277 | 10/1982 | Davis et al. | 363/21 X |

*Primary Examiner*—William M. Shoop
*Attorney, Agent, or Firm*—W. J. Benman, Jr.; W. J. Bethurum; A. W. Karambelas

[57] ABSTRACT

The invention includes a first switching transistor which is actuated by a logic signal. This switching transistor is disposed in a current path from the base of the power transistor. When this switch is actuated, the invention provides a large steady state base drive current superimposed with a base current peaking pulse from a current generator. The invention also includes a second switch which applies a reverse potential to the base of the switching transistor for fast turnoff. The specific embodiments disclose circuitry for regulating forward base drive current to minimize line voltage variations and component tolerances. An improved bipolar power transistor base drive circuit for switching regulator and DC to DC converter power supplies is disclosed.

16 Claims, 4 Drawing Figures

BASE DRIVE CIRCUIT

BACKGROUND OF THE INVENTION

1. Field of the Invention

This invention relates to power supplies. More specifically, this invention relates to circuits which drive power switching transistors used in switching regulator and DC/DC converter type power supplies.

While the present invention is described herein with reference to a particular embodiment in a particular application, it is to be understood that the invention is not limited thereto. Those having ordinary skill in the art to which this invention pertains will recognize modifications and other applications within the scope of the invention.

2. Description of the Prior Art

Voltage regulating power supplies generate single or multiple output DC voltages for a given load within specified limits. Simple resistive series and/or shunt regulating type power supplies were frequently used highly inefficient regulating techniques. In fact, until high current, low forward drop transistors became available, these series or shunt resistive regulating schemes were typically used up to power levels of one thousand watts.

To improve the efficiency of power supplies, switching mode power supplies, such as switching regulators and DC to DC converters, were developed. Switching regulator power supplies, for example, achieves higher efficiencies by incorporating highly efficient switching devices to periodically couple input power to an intermediate reactive storage element which in turn provides relatively constant power to a system load. Instead of absorbing the voltage difference between the input and the desired output with a power dissipating element, the low impedance transistor switch is made to open and close periodically between input and output. The switch output varies between approximately 0 volts and the input voltage. The reactive energy storage element provides the average or DC value of this input.

A DC to DC converter functions as a DC transformer to efficiently change from one DC voltage level to another. This conversion usually is accomplished by using switching mode power transistors to convert the input DC voltage to an AC square wave and then converting this square wave to a higher or lower voltage amplitude via the turns ratio transformation of a power transformer. The transformer output square wave is then recitified and filtered to generate a new DC voltage level usually having a higher or lower voltage or a different ground reference than the input DC voltage power level.

The following patents disclosed illustrate prior art regulating schemes.

| Pat. No. | Patentee | Refer To |
| --- | --- | --- |
| 3,040,183 | Farnsworth | FIG. 1 |
| 3,076,135 | Farnsworth et al | FIG. 1 |
| 3,174,094 | Farnsworth et al | FIG. 1 |
| 3,569,818 | Farnsworth et al | FIG. 1 |
| 4,069,449 | Farnsworth | FIG. 1 |

See also *Switching and Linear Power Supply, Power Converter Design* by Abraham I. Pressman, published by the Hayden Book Company, 1977, pages 321-325.

In both switching regulators and DC/DC converters, the power transistor switch needs a base driving circuit to provide the specialized turn on and turn off waveforms as determined by the transistor specifications. Bipolar switching transistor specifications typically set forth three important characteristics for such a base drive circuit.

(1) Steady state (DC) ON base current should be adequate to keep the transistor in heavy saturation for the highest steady state collector current load. This base drive current should not, however, increase to excessive values during worst case conditions.

(2) At the instant of turn on the base drive should be much higher than the steady state value; i.e., a base current peaking pulse is required. The base current peaking pulse provides the necessary collector current to charge the collector circuit capacitance and other transient collector loads. For switching transistors the relationship between base current and collector current is given by the formula:

$$I_c = (\beta_S)(I_B)$$

where
 $I_c$ is collector current
 $\beta_S$ is saturated beta
 $I_B$ is forward base current.

(3) At the instant of turn off the switching transistor base to emitter voltage should reverse polarity by several volts in order to achieve the transistor manufacturer's guaranteed minimum switching times.

While high steady state base drive is typically easy to obtain, the simplest DC prior art base drive schemes do not achieve the base current peaking nor the required reverse base to emitter voltage drive for optimum switching transistor operation. Establishing such base current peaking and reverse base drive using prior art techniques is somewhat expensive in components and space.

One prior art technique for providing reverse base drive uses a coupling transformer in the base drive circuit with a magnetizing inductance so low that its core absorbs adequate energy from the driving source during ON time and uses it during OFF time to provide reverse base drive for fast turnoff.

This reverse base drive through transformer coupling has several disadvantages. For example, the coupling transformers work best when provided with square wave or sine wave inputs having a uniform duty cycle. Resetting the core with nonsymmetrical waveforms requires more complicated techniques. Yet such nonsymmetrical waveforms are likely in switching regulators where the duty cycle of the base drive signal may vary depending upon the unregulated input voltage and the load voltage.

A second disadvantage of reverse base drive through transformer coupling is that a steady state (DC) ON or OFF base drive signal cannot be applied to the switching transistor through the coupling transformer without the use of complicated 2 phase schemes. This disadvantage is particularly undesirable in a voltage regulator insofar as there are situations in which it may be necessary to have a switching transistor in its ON state for a substantial period of time or in its OFF state for a substantial period of time.

A third disadvantage of transformers as reverse base drive mechanisms is that the transformers are custom components which are expensive to specify, design, and manufacture.

SUMMARY OF THE INVENTION

The present invention substantially overcomes the shortcomings of the prior art by providing an improved switching regulator power switch transistor base drive circuit. The invention includes a first switching transistor which is actuated by a logic-signal from binary type control circuits; e.g., a logic gate or a comparator. This switching transistor is disposed in a current path of the base of the power switching transistor. When this switch is actuated, the invention provides the steady state base current as well as the forward base current peaking pulse. The invention also includes a second switch which supplies the reverse base-to-emitter potential to the switching transistor for reverse base drive current. The specific embodiments disclose additional circuitry for regulating forward base drive current to minimize line voltage variations and manufacturing tolerances that might cause the steady state base current to be either too high or too low.

DETAILED DESCRIPTION OF THE INVENTION

FIGS. 1 through 4 illustrate variations on the improved base drive circuit of the present invention. As discussed more fully below, each embodiment includes a first switch which applies forward drive to the base of the switching transistor and a second switch which applies reverse base drive to the switching transistor. Most of the embodiments also include current regulation circuitry to minimize the effect of variations in the line voltage and other tolerances.

Figure 1:
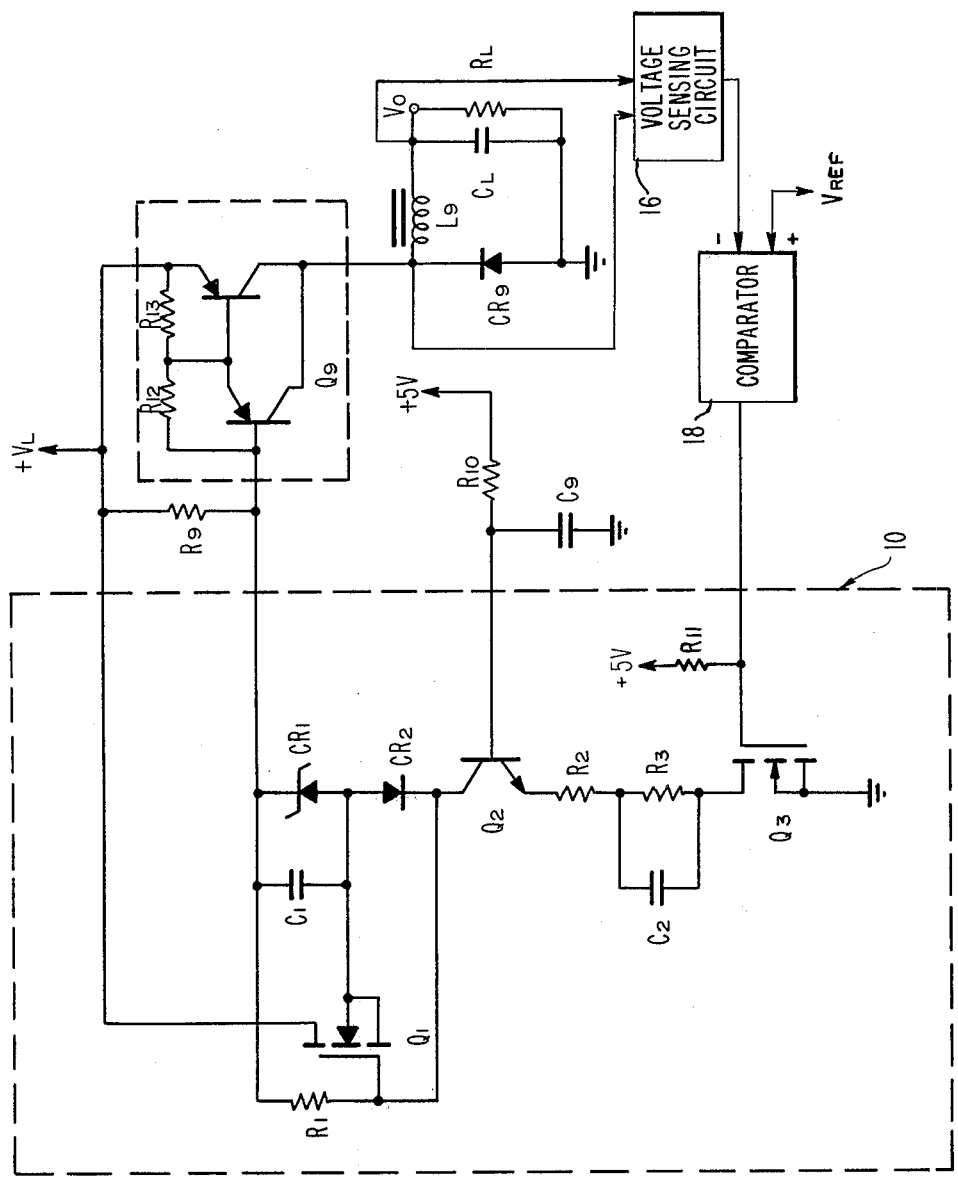
FIG. 1 is a schematic diagram of a first embodiment of the present invention.

In FIG. 1, the improved power switch drive circuit of the present invention is shown at 10 in an operational environment which includes a Darlington type power switching transistor Q9 which is emitter coupled to an unregulated line voltage $V_L$. A resistor R9 is connected between the base of transistor Q9 and the supply line voltage $V_L$. R9 in parallel with R12 plus R13 provide steady state OFF bias for Q9. The output of the switching transistor Q9 appears at the junction between a diode CR9 and inductor L9. The inductor L9 integrates the output of the switching transistor Q9. Diode CR9 serves as a fly back diode and provides a conduction path for the inductor L9 when the transistor Q9 goes OFF. A capacitor CL and the load resistor RL are connected between the inductor L9 and ground. CL provides high frequency decoupling between the load $R_L$ and the inductor L9.

The voltage sensing circuit 16 and the comparator 18 are shown in block diagram form to emphasize that these circuits may typically be provided in a switching regulator power supply and are not part of this invention. The design of these circuits is known to one of ordinary skill in the art. The design details are not required for an understanding of the present invention.

When the sensed output voltage from the voltage sensing circuit 16 exceeds the comparator reference voltage $V_{ref}$ the comparator 18 output goes low and turns ON the FET transistor Q3. The drain of the transistor Q3 is connected to the emitter of transistor Q2 through resistors R2 and R3. The base of transistor Q2 is biased to +5 V via R10 by an independent power supply not shown. A capacitor C9 shunts unwanted AC signals from the base of the transistor Q2 to ground.

Between the transistors Q2 and Q3 are the resistors R2 and R3 with capacitor C2 connected in parallel with the resistor R3. The collector of the transistor Q2 is tied to the base of the transistor Q9 through a zener diode CR1 and a second diode CR2. A capacitor C1 is connected in parallel with the zener diode CR1.

The invention includes a third transistor Q1 for providing reverse base drive to the transistor Q9. In the embodiment of FIG. 1, transistor Q1 is an FET with its drain connected to the unregulated line voltage $V_L$, its source connected to the junction of C1, CR1, and CR2, and its gate connected to the collector of transistor Q2 and the junction of the base of transistor Q9, C1, and CR1 through a resistor R1.

When the line voltage $V_L$ is present, the +5 volt regulated supply is provided which energizes transistor Q2. Assuming the transistor Q9 is initially OFF, its output is low. There will be no current flowing through the inductor L9 and no voltage drop across load resistor R1. The voltage sensing circuit 16 output will be below $V_{REF}$ so the comparator output will be high. This high output turns on transistor Q3 which in turn turns on transistor Q2, diodes CR1 and CR2 and transistor Q9. Thus, initially a current path is provided between the base of the transistor Q9 and ground through diodes CR1 and CR2, transistor Q2, resistor R2, capacitor C2, and transistor Q3. When capacitor C2 is fully charged, the direct current path is through resistor R2 and R3 in series instead of through R2 alone.

C2 provides Q9 base current peaking for fast turn-on. The resistor R2 serves to limit the Q9 forward base drive peaking current during initial turn-on. Capacitor C2 and resistors R2 and R3 provide two to one Q9 base current peaking in that the initial current through resistor R2 is twice the steady state current through resistor R2 for the component values given in Table I.

At the instant of Q9 turn-on its base current is established by R2. The initial Q9 base current is approximatedly:

$$I_{BQ9} = \frac{+5V - V_{BEQ2} - V_{DSQ3}}{R2}$$

After C2 is fully charged the Q9 base current is approximately:

$$I_{BQ9} = \frac{+5V - V_{BEQ2} - V_{DSQ3}}{R2 + R3}$$

For the preferred embodiment with the components of Table I below, the Q9 base current pulses to about twice its steady state value, and this peaking lasts for about 2 microseconds.

This peaking pulse allows the fastest turnon of the transistor Q9 during the transition period while minimizing the base drive during steady state conditions to a current level adequate to keep the power switching transistor Q9 in the saturated ON state.

The turn-on peaking pulse superimposed on the regulator turn-on steady state current is generally a preferred characteristic. This Q9 base current peaking pulse helps to discharge circuit capacitance at the Q9 collector. Also this Q9 base current peaking pulse provides the required increased base drive necessary to quickly remove the stored recovery charge of diode CR9. If CR9 is a fast recovery diode, the 2 microsecond period is more than adequate.

During the Q9 ON condition, the voltage drop across CR2 keeps Q1 off. Note that during this Q1 OFF condition, the current through R9 is not wasted because it helps to keep Q9 on.

With forward base drive applied to the transistor Q9, the transistor Q9 switches on, and the output voltage $V_o$ begins to rise. When it reaches the predetermined threshold, the comparator 18 goes low which turns transistor Q3 off. Q3 going off turns off transistor Q2 and diode CR2. When diode CR2 goes off, transistor Q1 comes on.

Q1 is a boot strapped voltage follower. Note that R1 is connected to C1 so that the voltage across R1 remains constant as Q1 goes to saturation; i.e. boot strapping. This boot strapped connection permits Q1 to connect high peak currents at minimal voltage drop. As a result, nearly all the voltage across C1 is available as a reverse bias voltage pulse to Q9. For example, if CR1 is a 4.3 volt zener diode, then Q9 will be reverse biased by nearly 4 volts. A 4 volt reverse bias is recommended by the Q9 transistor manufacturer MOTOROLA (2N6287) to be assured of getting the recommended turn off switching characteristics.

This invention thus reverse biases Q9 without the use of a base drive transformer.

Since there is no DC path from transistor Q1 through the emitter base junction of transistor Q9, Q1 cannot provide a steady state OFF signal for the switching transistor Q9. The steady state OFF drive for transistor Q9 is provided by the pull up resistor R9 in parallel with R12 and R13.

When transistor Q9 goes off, the output $V_o$ begins to come down until it is below the threshold; whereupon comparator 18 again comes on to reactivate transistor Q3.

During the OFF state, the capacitor C2 is restored through resistor R3. When the transistor Q3 is turned on capacitor C1 is charged by the current from Q2.

Table I below list typical specifications for the embodiment of FIG. 1.

TABLE I

| Component | Specification |
|---|---|
| R1 | 360 ohms |
| R2 | 20 ohms |
| R3 | 22 ohms |
| R9 | 220 ohms |
| R10 | 3.3 ohms |
| R11 | 430 ohms |
| R12 | 8k ohms |
| R13 | 40k ohms |
| C1 | 1 $\mu$F |
| C2 | 0.22 $\mu$F |
| C9 | 1 $\mu$F |
| CR1 | 1N3824 |
| CR2 | 1N4942 |
| CR9 | 1N3891 |
| Q1 | VN33AK |
| Q2 | 2N5682 or 2N6283 |
| Q3 | 2N6661 |
| Q9 | 2N6287 |

The semiconductor circuit components of this invention are available as off the shelf items from such manufacturers as MOTOROLA Inc. and Siliconics Inc. One of ordinary skill in the art will realize that the Siliconics VMOS FET Transistor Q1 (FIG. 1) of the present invention may be replaced by other switching means; e.g. a bipolar switching transistor (2N5682) or silicon controlled rectifier (2N2324).

Figure 2:
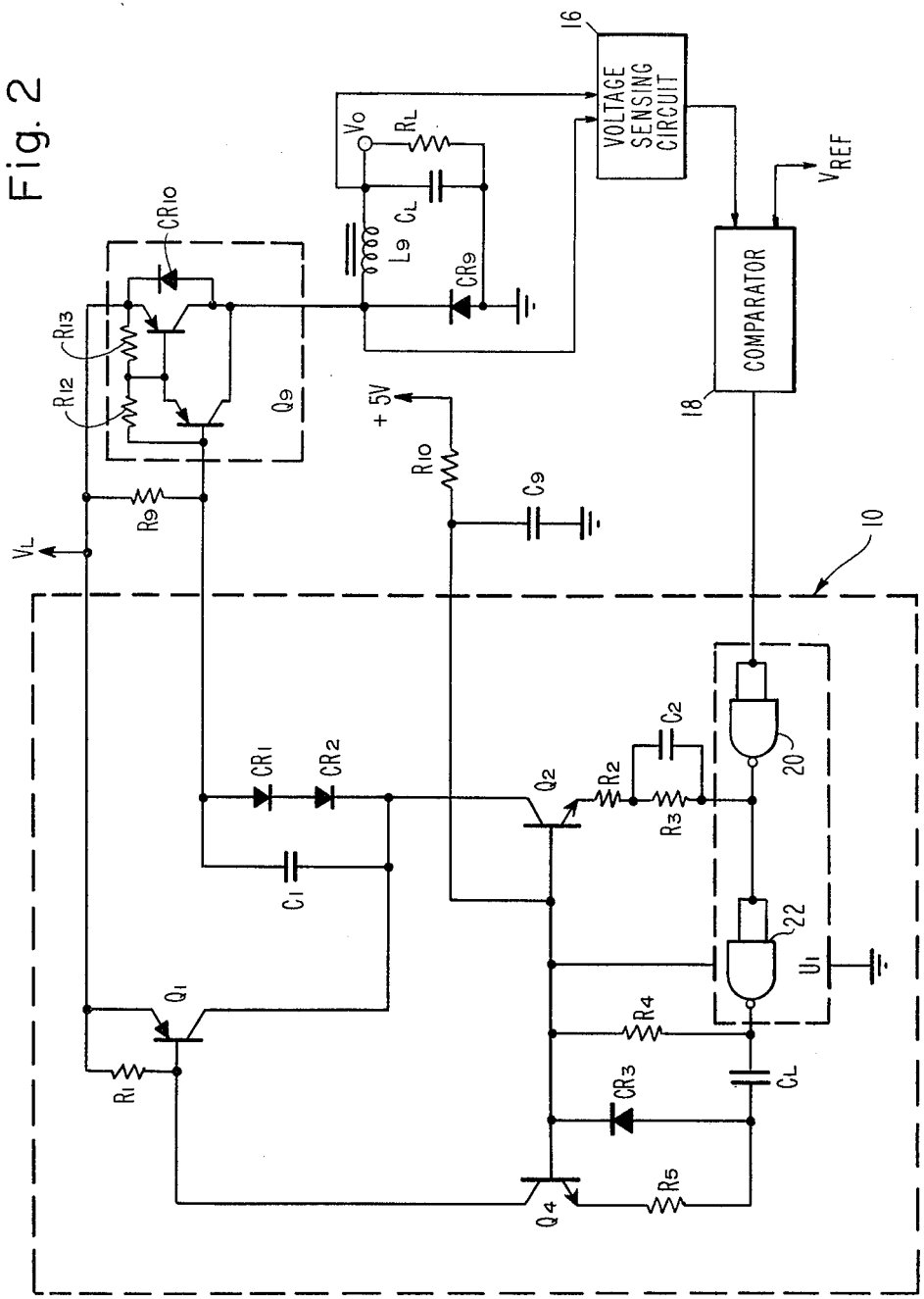
FIG. 2 is a schematic diagram of a second embodiment of the present invention.

FIG. 2 shows a low line voltage variation of the embodiment of FIG. 1. The field effect transistor Q1 of FIG. 1 has been replaced by a bipolar PNP transistor Q1 (2N5680) in FIG. 2. The resistor R1 has been reduced from 360 ohms to 100 ohms. In addition, in this embodiment, R1 is tied to $V_L$ instead of to the base of Q9. The collector of Q1 is connected to the junction of capacitor C1 diode CR2, and transistor Q2. The zener diode CR 1 of FIG. 1 has been replaced by a conventional diodes (1N4942). In the embodiment of FIG. 2, the transistor Q3 of FIG. 1 has been replaced with an integrated circuit driver U1 (SN55452) which includes two inverters 20 and 22. The driver U1 thus provides first switching means.

The embodiment of FIG. 2 also includes a fourth transistor Q4 which has its base connected to the base of transistor Q2, its collector connected to the base of transistor Q1, and its emitter connected to a resistor R5. The other end of resistor R5 is connected to a junction between diode CR3 and a capacitor C6. The cathode of the diode CR3 is connected to the base of Q4. The capacitor C6 is connected to the output of inverter 22 of driver U1. A resistor R4 is connected between the base of the transistor Q4 and the output of the driver U1.

The specifications for the embodiment of FIG. 2 are the same as those for the embodiment of FIG. 1 with the exception of those shown in TABLE II below.

TABLE II

| Component | Specification |
|---|---|
| R1 | 100 ohms |
| R2 | 22 ohms |
| R4 | 100 ohms |
| R5 | 47 ohms |
| C6 | 0.22 $\mu$F |
| CR1 and CR2 | 1N4942 |
| CR3 | 1N4150 |
| Q1 | 2N5680 |
| Q4 | 2N5682 |
| U1 | SN55452 |

When the line voltage $V_L$ is present, the +5 V regulated supply is provided to energize transistor Q2 and the comparator 18. Assuming transistor Q9 is initially off, the comparator 18 senses a voltage that is below the reference voltage. As a result, it turns on the driver U1. When the driver U1 is on the inverter 20 goes low thereby allowing current to flow through the collector path of transistor Q2 from the base of transistor Q9 to ground. (When inverter 20 goes low inverter 22 goes high to restore the charge on capacitor C6 via the current loop through CR3, C6, and R4). Thus transistor Q9 turns on, and the comparator 18 begins to sense a rising voltage.

When the sensed voltage exceeds the comparator 18 reference voltage, comparator 18 turns off the driver U1 which causes the inverter 20 to go high. This turns off Q2. When inverter 20 goes high, inverter 22 goes low. When inverter 22 output goes low, a current pulse flows in the emitter of Q4 and the base of Q1 for about 2 microseconds (using the component values specified in Table II) as the capacitor C6 charges.

The base current pulse at Q1 causes the Q1 collector current to go from cutoff to very hard saturation for the 2 microsecond duration of the base current pulse. This saturation of Q1 reverses the base emitter voltage of Q9 by about 1.4 volts. The 1.4 volts being the voltage charge existing on C1 due to the previous ON cycle of Q9.

This 2 microsecond reverse bias OFF pulse is a more than adequate period to turn off the Q9 transistor (2N6287) specified in Table II. This 2 microsecond period can be adjusted to be longer or shorter to accommodate different transistor types by changing the (R5)(C2) time constant. Once off, transistor Q9 is held off by R9 in parallel with R12 plus R13.

At the beginning of the next Q9 ON cycle inverter 20 goes low. The Q9 turn-on peaking pulse is generated by the (R3)(C2) time constant and current limited by R2 in the same manner as previously described for FIG. 1. This completes one cycle of operation of the FIG. 2 embodiment.

Figure 3:
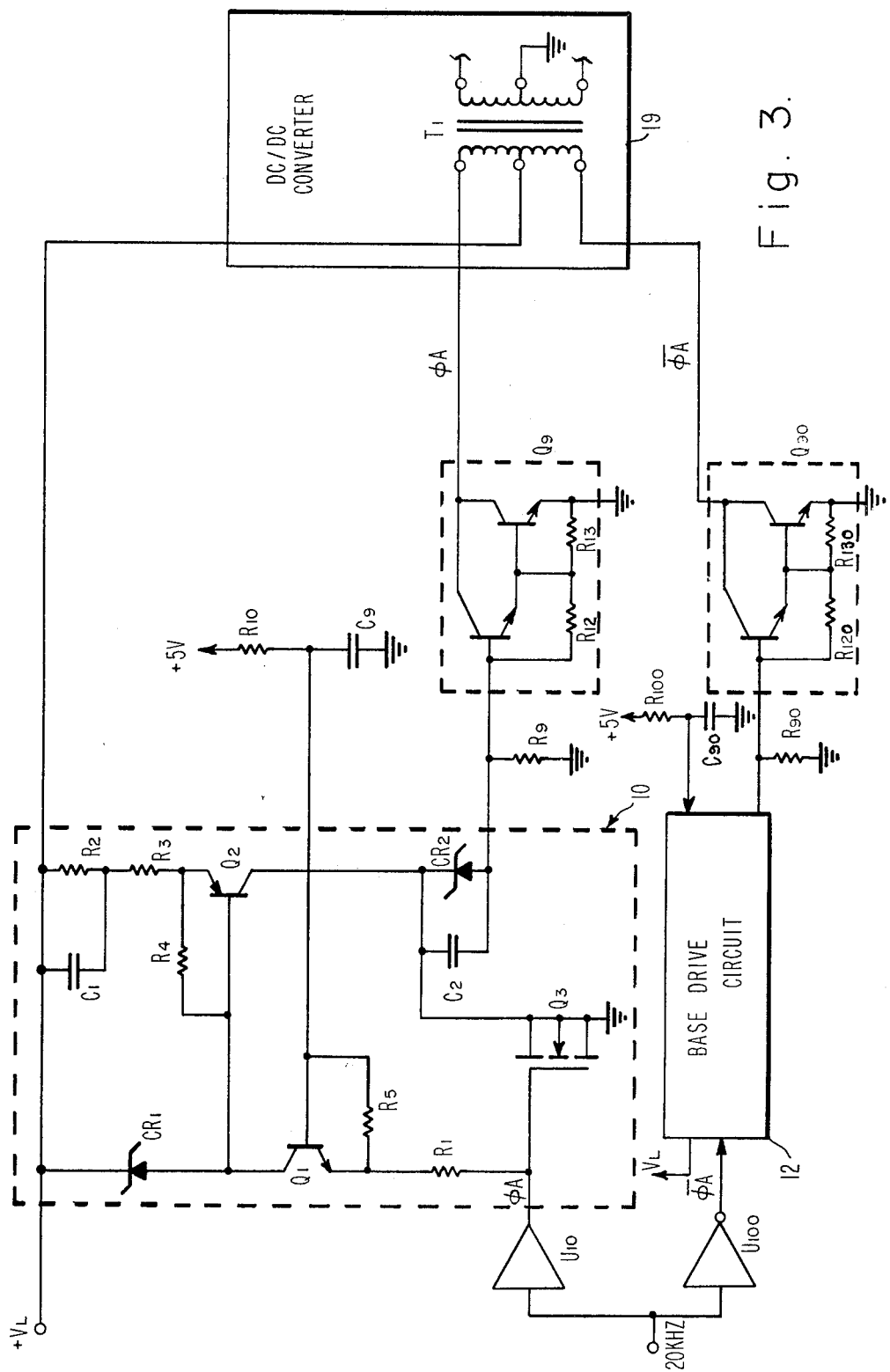
FIG. 3 is a schematic diagram of a third embodiment of the present invention.

The embodiment of FIG. 3 shows the improved base drive circuit 10 of the present invention adapted for NPN transistors. In this embodiment, the collector of the switching transistor Q9 is connected to a source of unregulated line voltage $V_L$ through the primary of a DC to DC converter transformer $T_1$. The DC to DC converter 19 (with its input transformer $T_1$) are shown in block diagram form to emphasize that these circuits may be typical for square wave driven DC to DC converters, and they are not part of this invention. Driven DC to DC converter 19 is known to one of ordinary skill in the art. The detail of the DC to DC converter circuit except for the input transformer are not necessary for the understanding of this embodiment of the invention.

The line voltage $V_L$ turns on the bias supplies and provides power to the drivers U10 and U100. When the square wave input is high, the driver U10 goes low and turns off Q3. Current generators Q1 and Q2 are turned on. The resistor R1 establishes the amplitude of steady state Q1 ON current. The zener diode CR1 establishes the ON base voltage for Q2. The resistor R5 increases the ON voltage signal to Q3 by avoiding the small $V_{BE}$ (off) drop of Q1. This allows the +5 volt system power to be used at the base of transistor Q1 while providing adequate gate signal drive for transistor Q3.

Q2 provides the forward base drive for the transistor Q9. Components C1, R2 and R3 and Q2 function as described above with regard to FIG. 1, i.e. constant current regulation, bypass for fast turn on, and steady state drive current all for transistor Q9. R1 and R3 also function as parasitic oscillation suppressors for the linear amplifiers Q1 and Q2 respectively. The resistor R4 dissipates the collector leakage current of Q2. Thus, R4 prevents Q2 from turning itself on when it should be off.

When the gate of transistor Q3 goes high, Q3 turns on an initiates the deactivation of Q9, and Q2. Most of the voltage across capacitor C2 is applied as reverse base drive on transistor Q9. In the embodiment of this figure, a steady state OFF condition is not required because the input signal is a steady state square wave. Steady state OFF is accomplished (though not required) by R9 in parallel with the resistor R12 plus R13 to provide a low enough resistance between base and emitter to hold the transistor off even at the highest operating temperatures.

It should be noted that the circuit of FIG. 3 may be adapted for a regulated $V_L$ (i.e., instead of unregulated $V_L$) by removing transistor Q1, resistor R5, resistor R10, and capacitor C9 and by connecting resistor R1 to zener dioded CR1. The base drive circuit 12 is identical in design and operation to that of the base drive circuit 10. Since its input is inverted by the inverter U100, it drives the transistor Q90 so that Q90 is on when Q9 is off and vice versa. This provides a push-pull input for the transformer $T_1$ of the DC to DC converter 19.

Typical specifications for the embodiment of FIG. 3 are shown in Table III below.

TABLE III

| Components | Specifications |
| --- | --- |
| R1 | 300 ohms |
| R2 | 22 ohms |
| R3 | 20 ohms |
| R4 | 2.2k ohms |
| R5 | 560 ohms |
| R9 & R10 | 220 ohms |
| R10 & R100 | 3.3 ohms |
| R12 & R120 | 8k ohms |
| R13 & R130 | 40 ohms |
| C1 | 0.1 μF |
| C2 | 1 μF |
| C9 & C90 | 1 μF |
| CR1 | 1N5231 |
| CR2 | 1N3824 |
| Q1 | 2N5682 |
| Q2 | 2N5680 |
| Q3 | 2N6661 |
| Q9 & Q90 | 2N6284 |
| U10 | 5407(1/6) |
| U100 | 5406(1/6) |

Figure 4:
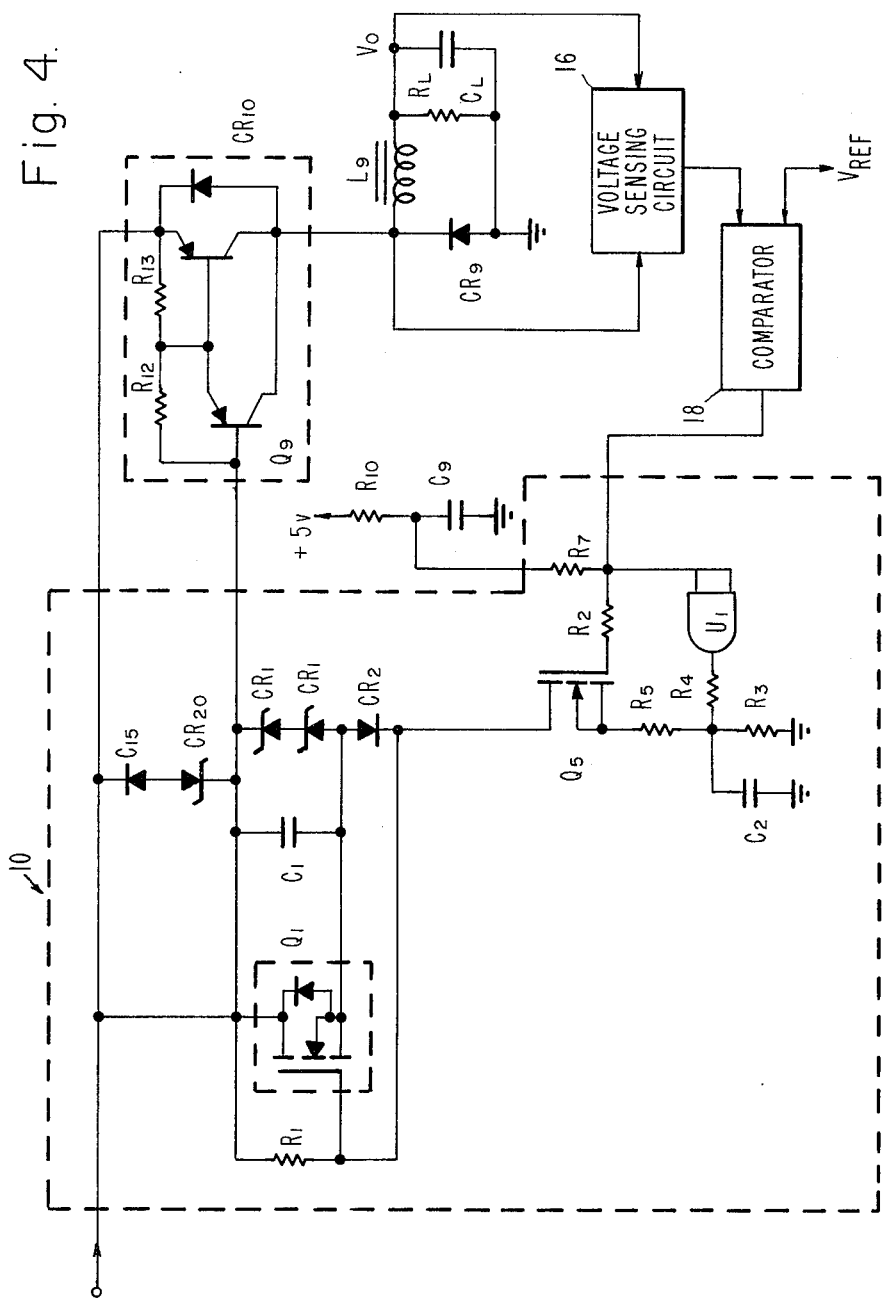
FIG. 4 is a schematic diagram of a fourth embodiment of the present invention.

The fourth embodiment as shown in FIG. 4 is preferred for lower parts count and smaller parts than FIG. 1. Its design resembles that of FIG. 1. There are however a number of exceptions. For example, the resistor R9 of FIG. 1 has been replaced with diodes CR15 and CR20 to show an alternative mechanization which prevents exceeding the maximum reverse base-emitter rating for Q9. The transistors Q2 and Q3 of FIG. 1 have been replaced by a single FET transistor Q2. This transistor provides both current regulation and switching. It includes resistors R5 and R3 in its source to ground path. Resistors R2, R7, and R10 are in series from the gate of Q2 to the regulated +5 V supply. Capacitor C9 connects from the junction of R10 and R7 to ground. Comparator 18 connects to the junction of R2 and R7. Capacitor C2 bypasses the resistor R3 to provide the transient turn-on peaking current for Q9 as discussed for FIG. 1. Comparator 18 drives transistor Q2 through resistor R2. The comparator also drives the amplifier U1. The amplifier U1 in turn drives the junction of C2, R3, and R5 via the current limiting resistor R4.

Typical parameters for the embodiment of FIG. 4 are shown in Table IV below.

TABLE IV

| Components | Specification |
| --- | --- |
| R1 | 360 ohms |
| R2 | 10 ohms |
| R3 | 100 ohms |
| R4 | 7.5 ohms |
| R5 | 39 ohms |
| R7 | 430 ohms |
| R10 | 3.3 ohms |
| R12 | 8k ohms |
| R13 | 60 ohms |
| C1 | 1 μF |
| C2 | .033 μF |
| C9 | 1 μF |
| CR1 | 1N3822A |
| CR2 | 1N4942 |

TABLE IV-continued

| Components | Specification |
| --- | --- |
| CR15 | 1N4942 |
| CR20 | 1N3823A |
| Q1 | VN33AK |
| Q2 | VN98AK |
| Q9 | 2N6287 |
| L9 | 250 μH (typical) |
| U1 | SN55450B |

The circuit as described in FIG. 4 and specified in Table IV is designed for an unregulated line voltage of about +28 volts. Selection of different components for Q2, Q9 and CR9 would provide higher line voltage or current handling capability without changing the invention.

In operation, the circuit is initially off. When line voltage is applied, the bias supplies and reference voltages are provided and the comparator 18 turns on. It immediately senses that the output voltage is low and turns on transistor Q2. When transistor Q2 turns on, forward base drive is provided to transistor Q9 through zener diode CR1, diode CR2, R5, and C2 in parallel with R3. Driver U1 is off, its output is high.

At the instant Q9 turns on, its base drive current amplitude pulses to about 3.5 times its steady state amplitude. (This base current peaking pulse lasts for about 2 microseconds if the component values specified in Table IV are used). The forward base drive current for the peaking pulse and the steady state amplitude are set by R3, R5, C2, Q5 and the amplitude of the regulated bus (+5 volts). The peaking pulse time constant is equal to C2 times the parallel combination of R3 and R5. The ratio of the peaking pulse current to the steady state current is set by the ratio of R5 to (R5+R3). Note that the transistor Q2 is a linear mode (active region) current generator which transmits the peaking pulse and steady state currents to the base of the transistor Q9 via CR1 and CR2.

The peaking pulse superimposed on the steady state current is a generally preferred characteristic as previously explained. This Q9 base peaking current pulse helps to discharge circuit capacitance at the collector of Q9 as well as provide initial drive to quickly remove the recovery charge of CR9 as previously explained for FIG. 1.

Diodes CR1, CR2 and transistors Q2 and Q9 are on during the steady state ON condition. Q1 is held off by the voltage drop across diode CR2. Q2 provides current regulation to minimize the effect of noise and of variations in the line voltage $V_L$ or variations in the $V_{BEQ9}$, $V_{CR1}$, and $V_{CR2}$. This current generator Q2 is the electrical equivalent of the floating secondary winding on prior art transformer coupled designs.

When the output voltage exceeds the reference threshold $V_{REF}$, the comparator 18 turns transistor Q2 off and also it turns on U1. U1 quickly discharges C2 so that its voltage is set to about zero to be ready for the next Q2 on cycle. As is discussed above with regard to FIG. 1, when Q2 goes off, the drop across CR2 is removed and transistor Q1 turns on. This applies the voltage across C1 as reverse base drive for transistor Q9. Diodes CR15 and CR20 prevent the reverse bias from exceeding the maximum reverse bias rating of the transistor Q9.

Note that the gate resistor R1 is connected to C1 and not to $V_L$. Thus, the Q1 gate to source voltage is boot strapped to the voltage across C1. The bootstrap allows Q2 to stay in saturation longer to keep the reverse base-emitter voltage of Q9 equal to the magnitude of the stored voltage across C1. During the steady state OFF condition, the voltage across C1 slowly decays to zero via the internal base resistors of Q9; i.e., R12 and R13. These resistors keep Q9 off during the steady state off condition. If Q9 did not have internal resistors or if very high temperature operation were contemplated, an external resistor would have to be added from the base of Q9 to $V_L$.

During the next turn on cycle, the voltage across C1 is quickly restored by the current through Q2, and the C1 voltage is clamped by the zener diode CR1.

The use of U1 in this FIG. 4 embodiment provides an additional feature that may be very useful in some applications. Without U1 the voltage across C1 must be restored to nearly zero by action of the (C2)(R3) time constant. With U1 in the circuit the voltage across C2 is restored to nearly zero by a much faster time constant, (C2)(R4). This feature allows DC restoration of C2 for very high Q9 duty cycles. This quick restoration is a very useful feature for some applications, but if it is not required, the U1 and R4 can be eliminated from the circuit.

The present invention has thus been described with reference to particular embodiments and particular embodiments. It is to be understood that modifications to the invention may be made by those having access to the teaching of this invention and ordinary skill in the art. A typical modification may include the substitution of different types of transistors for those specified in the above embodiments. As mentioned above, the invention may be modified to accommodate line voltages whether regulated or unregulated at levels higher or lower than those specified. It is contemplated by the appended claims to cover and and all such modifications.

What is claimed is:

1. In a power supply having a power transistor with at least three terminals and means for sensing the output at the first terminal thereof, a circuit for providing forward and reverse base drive for the power transistor comprising:
    first switching means coupled to the means for sensing the output of the power transistor for selectively closing a direct current path from a second terminal of the power transistor to a first terminal to provide forward base drive therefor;
    current regulating means in said direct current path for minimizing the effect of variations in the potential applied at the second terminal of the power transistor; and
    second switching means coupled to said current path and a source of potential energy for applying said source of potential energy to the second terminal of the power transistor to provide reverse base drive therefor.

2. The circuit of claim 1 wherein said second switching means is activated by the absence of current in the direct current path.

3. The circuit of claim 2 wherein said switching means is deactivated by means of a voltage drop across a diode disposed in said current path.

4. The circuit of claim 3 wherein said source of potential energy is provided by a capacitor.

5. The circuit of claim 4 wherein a zener diode is connected in parallel with said capacitor.

6. The circuit of claim 5 wherein said second switching means is a transistor.

7. The circuit of claim 6 wherein said transistor is a field effect transistor.

8. The circuit of claim 1 wherein said current regulating means includes means of providing a base current peaking pulse which is greater than the steady state current in said current path.

9. The circuit of claim 8 wherein a second transistor is disposed in said current path.

10. The circuit of claim 9 wherein said first switching means is a third transistor.

11. The circuit of claim 10 wherein said first switching means is a field effect transistor disposed in said current path.

12. The circuit of claim 8 wherein said means for providing a base current peaking pulse includes a capacitor and a resistor.

13. A power switch drive circuit for providing forward and reverse base drive including:
first switching means for providing base drive, said first switching means including a transistor operatively coupled to means for sensing the output of said power switch; and
second switching means for providing reverse base drive, said second means including a second switching transistor operatively coupled to sense the current flows through said first switching transistor, a capacitor, and means for setting the charge on said capacitor such that said charge on said capacitor is applied by said second switching means to the base of said power transistor.

14. The circuit of claim 12 including means for regulating the forward base drive applied to said power transistor.

15. The circuit of claim 13 wherein said means for regulating forward base drive includes a third transistor, first and second resistors and a diode disposed in the current path between the base of said power transistor and said first switching transistor.

16. The circuit of claim 14 including means for providing a forward base drive pulse current which is at least twice the steady state base drive pulse current including a capacitor mounted in parallel with said second resistor.

* * * * *